United States Patent [19]

Nelson

[11] Patent Number: 4,466,859
[45] Date of Patent: Aug. 21, 1984

[54] PROCESS FOR ETCHING COPPER

[75] Inventor: Norvell J. Nelson, Palo Alto, Calif.

[73] Assignee: PSI Star, Inc., Hayward, Calif.

[21] Appl. No.: 558,626

[22] Filed: Dec. 6, 1983

Related U.S. Application Data

[63] Continuation-in-part of Ser. No. 497,887, May 25, 1983, , which is a continuation-in-part of Ser. No. 450,685, Dec. 17, 1982.

[51] Int. Cl.³ .................... C23F 1/02; B44C 1/22; C03C 15/00; C03C 25/06
[52] U.S. Cl. ................... 156/646; 156/659.1; 156/666; 156/902; 252/79.1; 252/79.4
[58] Field of Search ........... 156/640, 646, 656, 659.1, 156/664, 666, 901, 902; 252/79.2, 79.4, 79.1, 142, 146; 134/3, 41

[56] References Cited

U.S. PATENT DOCUMENTS 2,428,464  10/1947  Lum et al. .................... 252/79.2
2,908,557  10/1959  Black et al. .................. 252/142 X Primary Examiner—William A. Powell
Attorney, Agent, or Firm—Flehr, Hohbach, Test, Albritton & Herbert

[57] ABSTRACT

Process and structure for etching copper, as in the manufacture of printed circuit boards. The copper is exposed to a gaseous or liquid oxidant in the presence of a catalyst which promotes the reaction of copper with the oxidant. In some embodiments, the catalyst is carried by a medium which also serves as a receiver for oxidized copper species produced by the reaction, and in one preferred embodiment, the medium comprises a laminated structure having a first layer which contains a catalyst and a second layer which receives the oxidized copper species. The etching is substantially anisotropic, which alleviates the problem of undercutting.

5 Claims, 1 Drawing Figure

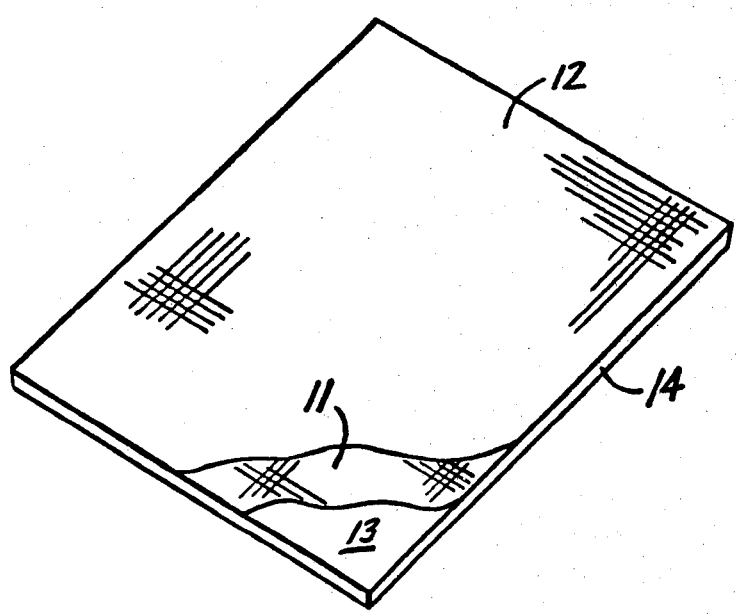

PROCESS FOR ETCHING COPPER

This is a continuation-in-part of Ser. No. 497,887, filed May 25, 1983, which is a continuation-in-part of Ser. No. 450,685, filed Dec. 17, 1982.

This invention pertains generally to the etching of copper, and more particularly to a process and structure for removing copper in the manufacture of printed circuit boards.

Heretofore, copper foil has been removed from laminated boards by the use of liquid etchants in the manufacture of printed circuit boards. In some cases, the boards are immersed in a bath of the liquid etchant for a time sufficient to dissolve the copper, and in other cases the boards are sprayed with the etchant. In either case, the etchant employed is a reactive and corrosive liquid which is difficult to handle, and the spent reagent and the reaction products are generally in a form which is difficult to dispose of properly. Liquid etchants also produce undesired undercutting of the conductors formed on the boards, and the minimum line width which can be formed with liquid etchants is limited.

It is known that copper will react with gaseous nitrogen dioxide according to the relationship $$Cu + 4NO_2 \rightarrow Cu(NO_3)_2 + 2NO,$$

and that the oxidation or removal of copper by this reaction can be enhanced or promoted by the use of a polarized organic catalyst. The active mechanism in this reaction is thought to be the reaction of the nitrosonium ion $NO^+$ with metallic copper, i.e., $$Cu + NO^+ \rightarrow Cu^+ + NO,$$

and the reaction rate is maximized when the number of $NO^+$ ions is greatest.

Even though the nitrogen dioxide itself is a gaseous material, the catalysts heretofore employed to promote the reaction of nitrogen dioxide with copper have been highly volatile, flammable liquids, and processes using nitrogen dioxide and these catalysts are still basically wet etching processes. These processes have not, to applicant's knowledge, been employed in the manufacture of printed circuit boards, and they are subject to many of the same limitations and disadvantages as processes using liquid etchants.

It is also known that copper will react with chlorine in an aqueous environment, but this has heretofore been thought to be a slow process which is not suitable for removing copper in the manufacture of circuit boards.

The etchant chemistries heretofore utilized in the removal of copper from circuit boards have generally been water-based processes, with some operating in alkaline solutions and others in acidic solutions. In these etch systems, copper exists in one of three states: metallic copper or $Cu(O)$, cuprous copper or $Cu(I)$, or cupric copper or $Cu(II)$. The most commonly used etching chemistries have different components that complex and solvate the oxidized copper species $Cu(I)$ and $Cu(II)$ and control their relative stabilities.

The etching processes heretofore utilized for the dissolution of metallic copper on circuit boards have been based upon the oxidation of metallic copper $Cu(O)$ by cupric copper $Cu(II)$ as the fundamental chemical process responsible for the dissolution of the copper. In these processes, two $Cu(I)$ species are produced by the reaction. These processes require that both the oxidant $Cu(II)$ and the product $Cu(I)$ be readily soluble for ease of removal from the circuit board surface. Since it is difficult to maintain reasonable amounts of both $Cu(I)$ and $Cu(II)$ in an aqueous solution, these processes require precise control of all reaction parameters such as temperature, pH, concentration of all components, and reaction time. This can often be difficult, and a common problem of these processes is the deposition of an unsoluble surface scum containing $Cu(I)$ species. These surface contaminants are difficult to remove and can lead to serious problems in subsequent process steps or to corrosion problems in the finished product.

Another limitation of the prior chemistries for removing copper is that the reaction with metallic copper is isotropic, that is, the etching action in the copper film proceeds around a resist pattern in both the desired vertical direction and the undesired horizontal direction at the same rate. Hence, a certain amount of copper will be removed from under the resist, leading to irregularities in the circuit elements formed on the substrate. While in the extreme case, this undercutting can lead to serious problems such as short-circuiting and trace lifting, it also imposes a practical limitation on circuit element dimensions and, hence, circuit density. These limitations are becoming more significant as circuit board density is falling far behind circuit component (semiconductor) density.

The chemistries previously employed for removing copper employ hot corrosive solutions that place substantial materials constraints on the construction of processing equipment, often requiring metal components to be fabricated of relatively expensive materials such as titanium. In addition, as noted above, there is a problem in disposing of large quantities of aqueous solutions containing copper. Even if the dissolved copper is precipitated to a relatively low concentration, the solution often contains other components that require additional treatment before disposal.

It is in general an object of the invention to provide a new and improved process and structure for etching copper in the manufacture of printed circuit boards and in other applications.

Another object of the invention is to provide a process and structure of the above character in which the problems of handling the reactive and corrosive chemicals of a wet etching process are avoided.

Another object of the invention is to provide a process and structure of the above character in which there are no dilute waste solutions of copper that would require extensive treatment before disposal.

Another object of the invention is to provide a process and structure of the above character in which the oxidized copper is in a solid form which is convenient for copper recovery.

These and other objects are achieved in accordance with the invention by providing a dry etching process in which the copper is exposed to a gaseous oxidant in the presence of a catalyst which promotes the reaction of copper with the oxidant. In some embodiments, the catalyst is carried by a non-liquid medium which also serves as a receiver for oxidized copper species produced by the reaction. In one preferred embodiment, the non-liquid medium comprises a laminated structure having a first layer which carries the catalyst and a second layer which receives the oxidized copper species.

The single FIGURE of drawings is an isometric view, partly broken away, of one embodiment of a catalytic carrier and receiver for oxidized copper products according to the invention.

In the dry etching process of the invention, the copper to be removed is exposed to a gaseous oxidant such as nitrogen dioxide in the presence of an organic catalyst, and the oxidized copper species produced by the reaction are removed in a substantially solid form. The reaction can be carried out at room temperature and at atmospheric pressure.

The primary function of the catalyst is to promote the splitting of an $NO_2$ dimer to form the nitrosonium ion $NO^+$ which reacts rapidly with the copper to be removed. The splitting of the dimer is illustrated by the following relationship:

$$(NO_2)_2 \rightarrow NO^+ + (NO_3)^-.$$

Since this reaction involves the separation of oppositely charged species, it will occur at a faster rate in the presence of a medium having a relatively high dielectric constant. It has been found, however, that a large quantity of the dielectric medium is not required and that the reaction will proceed at a reasonable rate if the copper surface is covered with only a thin film of a suitable organic material.

In general, organic compounds which are useful as catalytic agents for the promotion of the reaction of nitrogen dioxide with copper should have electron donor properties which will promote the ionic cleavage of the $NO_2$ dimer, or they should have a high dielectric constant which will support this ionic separation. Examples of suitable polar organic compounds are set forth below in Table 1.

TABLE 1

| CATALYTICALLY ACTIVE COMPOUNDS | |
|---|---|
| Nitriles | Carboxylic Acid Anhydrides |
| Acetonitrile | Acetic Anhydride |
| Adiponitrile | Maleic Anhydride |
| Benzonitrile | Succinic Anhydride |
| Esters | Amides |
| Ethyl Acetate | N,N—Dimethylformamide |
| Dimethyl Succinate | N,N—Dimethylacetamide |
| Dibutyl Phthalate | N—Methylpyrrolidone |
| Dimethyl Glutarate | |
| Ethylene Glycol | Nitrosoamines |
| Diacetate | Diethylnitrosoamine |
| Dimethyl Adipate | |
| Nitro Compounds | Combinations |
| Nitromethane | Ethyl Cyanoacetate |
| Nitroethane | Ethylene Glycol Monoethyl Ether Acetate |
| Ethers | |
| Diethyl Ether | Diethylene Glycol Monoethyl Ether Acetate |
| Dioxane | |
| Carboxylic Acids | |
| Acetic Acid | Sulfoxides |
| Adipic Acid | Dimethyl Sulfoxide |
| Benzoic Acid | |
| Hydroxylic Compounds | |
| Water | |
| Methanol | |
| Ethylene Glycol | |
| Glycerine | |

Of these compounds, the following are particularly preferred: adiponitrile, ethyl acetate, ethylene glycol diacetate, dimethyl succinate, dimethyl glutarate, dimethyl adipate, dioxane, acetic acid, acetic anhydride, ethyl cyanoacetate, diethylene glycol monoethyl ether acetate, and mixtures of these. The more preferred compounds have relatively high boiling points (e.g. 200° C. or more) and are safer and easier to use than compounds with lower boiling points.

Polymers containing catalytically active functional groups can also be used in the dry etching process. Under some circumstances the polymers may be preferred since they can give better control over the spatial distribution of the catalyst. Examples of suitable polymers are given below in Table 2.

TABLE 2

| POLYMERIC CATALYSTS FOR PROMOTION OF THE COPPER ETCHING REACTION |
|---|
| Nitrile Polymers |
| Poly(acrylonitrile) |
| Cyanoethyl cellulose (nitrile and ether functions) |
| Esters |
| Poly(vinyl acetate) |
| Poly(ethyl acrylate) |
| Poly(methyl methacrylate) |
| Poly(ethylene terephthalate) |
| Cellulose acetate (ester and ether functions) |
| Ethers |
| Poly(ethylene oxide) |
| Poly(methyl vinyl ether) |
| Carboxylic Acids |
| Poly(acrylic acid) |
| Carboxylic Acid Anhydrides |
| Copoly(maleic anhydride-butadiene) |
| Amides |
| Poly(N—vinyl pyrrolidone) |
| Polyacrylamide |
| Hydroxylic Polymers |
| Poly(ethylene glycols) |
| Poly(vinyl alcohol) |
| Cellulose |

If a resist material is used to protect the copper where it is not to be removed, in an embodiment preferred for its ability to etch through the copper foil without spreading laterally and undercutting the resist, the exposed surface of the copper and the resist material is covered with a hydrogel of water and a polymer, such as polyacrylamide or poly(acrylic acid), containing a surfactant. Exposure to $NO_2$ results in anisotropic etching of the copper. Suitable surfactants include DuPont Zonyl FSC, Zonyl FSK and Zonyl FSN and 3M Fluorad FC-135, useful concentrations of the surfactant include a range on the order of 0.001–0.01 percent by weight, with a preferred concentration of 0.002–0.003 percent. Dry film organic resists such as DuPont's Riston or wet film organic resists such as Kodak 752 can be used.

The addition of a small amount of phosphoric acid and a smaller amount of organic phosphate such as Zonyl FSP detergent to the mixture above allows anisotropic etching of copper masked by lead-tin solder without appreciable attack of the solder resist. Suitable amounts of phosphoric acid include 5–25 percent by weight, with a preferred range of 8–12 percent, and the amount of phosphate is preferably similar to the concentration of the surfactant, i.e. 0.001–0.01 percent by weight, with a preferred range of 0.002–0.003 percent.

The polymeric catalysts can be employed in several different ways. For example, the copper surface can be covered with a dry (pure) film of solid poly(ethylene oxide) which becomes a catalytically active material for the Cu—NO$_2$ reaction when heated to its melting point. The reaction occurs only in the polymer melt, and using this technique, it is possible to form a pattern in the copper during the etching process itself, without an intervening resist step.

In another useful application, a polymer gel is used as a carrier for a more mobile catalytic compound. For example, a reasonably thick gel can be formed from a solution of cyanoethyl cellulose (7 wgt%) in ethyl cyanoacetate. In this case, the polymer serves to spatially fix the more mobile catalyst, in essence acting as a container without walls. The low polymer content of this gel permits a high diffusion rate for the reactants through the catalytic medium while maintaining a fairly rigid structure.

The reaction between nitrogen dioxide and copper can also be carried out utilizing a solution of a polymer in an active catalytic liquid. For example, a film formed by a combination of poly(N-vinyl pyrrolidone) dissolved in adiponitrile can be applied to the copper surface as a tacky film which at elevated temperatures has sufficient permeability to permit a reasonable reaction between the nitrogen dioxide and the copper. A polymer solution of vinyl acetate (20 wgt%) in ethyl acetate acts in a similar manner, although the higher polymer loading does inhibit the diffusion of the reactant to some extent.

It has been found that operation of the process can be simplified somewhat by including a predetermined amount of oxidant in liquid form in the polymer-containing medium prior to spreading on the copper substrate. A preferred liquid oxidant for this purpose is N$_2$O$_4$, the liquid dimer of nitrogen dioxide.

In one example of the process utilizing a liquid oxidant, approximately 5% cellulose, 21.6% N$_2$O$_4$, 30.7% acetonitrile and 42.7% Dupont DBE (by weight) are mixed together. This mixture is applied in the form of a thin film to the surface of the copper and maintained in contact with the copper until the copper is dissolved. When the reaction has taken place, the film and the dissolved copper are removed from the substrate. Utilizing 14 grams of this mixture, a 3×4 inch section of circuit board having a ½ oz copper coating was etched at room temperature in approximately 5 minutes. Portions of the copper were masked with Kodak 752 micro resist, and substantially all of the exposed copper was removed in about 5 minutes, with very little understanding of the copper circuit elements beneath the resist. Dupont DBE is a mixture of dimethyl esters of adipic, glutaric and succinic acids.

In another example, 9.19 grams of 10% cellulose acetate in acetonitrile, 0.36 gram of Henkel Aliquat 336 (a surfactant) and 2.90 grams of N$_2$O$_4$ were mixed together. This mixture was applied as a thin film over a copper circuit board having a photoresist pattern formed thereon. After approximately 7½ minutes of contact, the solution was removed, and substantially all of the copper not protected by the resist pattern was gone.

While only two specific examples utilizing a liquid oxidant have been given, it will be understood that a liquid oxidant can be employed in the other processes disclosed herein utilizing a gaseous oxidant.

It has also been found that the catalytic quantities of solvent required for the Cu—NO$_2$ reaction can be carried in materials such as non-woven fabrics and some woven fabrics. These materials can serve both as the carrier for the catalyst and as the receiver for the copper nitrate or other reaction products. The catalytic solvent can be adsorbed into the material or it can be carried as a film on the surface of the material. It can exist as a solid at room temperature and can be raised to its melting point before initiation of the Cu—NO$_2$ reaction. Carriers such as the fabric materials can also carry patterns which will define the copper circuitry to be formed by the etching process.

It is possible to carry the catalytically active compound in a solid support such as the high surface area network offered by non-woven fabrics. In this mode, the catalyst is carried by the support which fixes the catalyst to the copper surface much like the polymer systems described above. However, due to the porous structure of the fabric, this carrier offers negligible resistance to the transport of the gaseous reactants and the reaction products. Examples of non-woven fabrics suitable for use in this process are given below Table 3.

TABLE 3

REPRESENTATIVE NON-WOVEN FABRIC MATRICES

Non-woven Polyester
  Hydrophilic material from Pellon Corporation
    Pellon 954
    Pellon TD20
    Pellon P30
  Hydrophobic material from Eaton-Dikeman
    Hollytex 3251
    Hollytex 3257
    Hollytex 3283
  Non-woven Nylon from Monsanto
    Cerex 0.3 oz/yd$^2$
    Cerex 2.0 oz/yd$^2$
Non-woven Poly(propylene)
  From Crown Zellerbach
    Celestra C43W
    Celestra C150
  From Reigal Division, James River Corporation
    Polyweb
Non-woven Fiberglass Mats
  TAP Plastics
    Surfacing Mat
    Glass Mat 2 oz. Density The use of the fabric carrier has the additional advantage of being essentially a dry process. In one example, an adiponitrile catalyst was carried in a Pellon 954 non-woven polyester fabric, and the catalyst-carrying fabric was placed in contact with a copper foil, and the entire structure was exposed to nitrogen dioxide gas. The reaction between the nitrogen dioxide and the copper began immediately, with a copper nitrate product being adsorbed by the fabric support during the course of the reaction. The area of copper removed corresponded to the outline of the polyester carrier. With a non-woven fabric as a carrier for the catalytic solvent, it was found that a copper layer equivalent to 1 oz/ft$^2$ can be etched in 20 minutes using gaseous nitrogen dioxide at room temperature. Essentially all of the oxidized copper was removed with the fabric carrier.

The drawing illustrates a laminated structure which is particularly suitable for applying the catalyst to a copper surface and carrying away the oxidized copper species. This structure comprises a carrier layer 11 backed by a receiver layer 12. The carrier layer can, for example, consist of a very thin hydrophobic layer of non-woven polypropylene, and the receiver layer can, for example, consist of a thicker porous hydrophilic material such as a non-woven cellulose mat. With a nitrogen dioxide oxidant, for example, the carrier layer contains the polar organic catalyst, and the cellulose mat serves as a receiver for the copper nitrate produced by the reaction. Experiments have shown that neither of these layers presents a significant barrier to either the nitrogen dioxide or the copper nitrate produced by the reaction. Passage of the copper nitrate through the thin hydrophobic membrane can be facilitated by a suitable phase transfer catalyst, if desired.

In use, the laminated structure shown in the drawing is placed on the copper foil 13 of a printed circuit board 14, with carrier layer 11 in contact with the surface of the copper. The entire assembly is exposed to nitrogen dioxide or other gaseous oxidant, and after a suitable reaction time (e.g. about 15 minutes or less), the entire laminate can be stripped from the copper surface, leaving behind the desired copper pattern and removing the oxidized copper in a dry solid form.

An etched pattern can be defined on the copper surface by a suitable organic mask placed either on the copper foil or on the carrier layer in contact with the copper. A conventional photoresist can be employed in this process since copper and nitrogen dioxide do not react in the absence of the catalyst. It should be noted that the reaction takes place only where the catalyst is present. Consequently, there is relatively little undercutting of the remaining copper.

Additional examples of gaseous oxidants which are suitable for use in the process of the invention are set forth below in Table 4. These gases include nitrogen oxides, nitrogen oxyhalides, halogens, and mixtures thereof.

TABLE 4
GASEOUS OXIDANTS

Nitrogen Oxides
Dinitrogen Tetroxide (Dimer of Nitrogen Dioxide)
Dinitrogen Trioxide (+ Oxygen)
Nitrogen Dioxide
Nitric Oxide (+ Oxygen)

Nitrogen Oxyhalides
Nitrosyl Chloride

Halogens
Chlorine
Bromine
Mixtures of the above

While the direct reaction of chlorine with copper has heretofore been thought to be too slow to be useful in the manufacture of printed circuit boards, it has been found that the reaction proceeds at a useful rate in the presence of a suitable receiver and catalyst. With chlorine gas, nitric oxide is a suitable catalyst, as are some of the other gaseous oxidants of Table 4. Water or one of the other chemical compounds of Tables 1 and 2 can be employed as a co-catalyst, and the catalyst and co-catalyst can be carried by a receiver of cellulose material or one of the other receiver materials of Table 3 in an essentially dry form. The chlorine gas reacts with the copper only in the areas in which the receiver is in contact with the copper, and this provides a convenient method of forming patterns in the copper. Of the catalysts set forth in Tables 1 and 2, the hydroxylic compounds are particularly preferred for use as co-catalysts with gaseous chlorine oxidants.

It has been found that the etching process with a gaseous chlorine oxidant proceeds substantially faster in the presence of a co-catalyst than it does when the co-catalyst is not employed. In one case, for example, 10 milligrams of copper were removed from a copper circuit board with chlorine and a fiberglass receiver containing water as the only catalyst. When nitrogen oxide was added to the gaseous oxidant stream, copper was removed from a similar circuit board at a rate of 239 milligrams in one-half hour.

The catalytic nitrogen oxide can be introduced as gaseous NO as in the above example, or it can be in the form of one of the nitrogen containing compounds of Table 4 such as nitrogen dioxide or nitrosyl chloride. It can also be carried in the receiver as a salt such as sodium nitrite, in which case water or another liquid can serve as a transport agent for the catalyst.

The laminated carrier-receiver structure shown in the drawing can also be employed with a gaseous chlorine oxidant. In this embodiment, the hydrophobic polymer layer 11 contains a film of a hydrophobic phase transfer catalyst such as Henkel Aliquat 336, with a cellulose backing layer 12 serving as a receiver for $CuCl_2$ produced by the reaction. The phase transfer catalyst contains a $Cl^-$ carrier which passes the $CuCl_2$ product through the hydrophobic layer as the $(CuCl_3)^-$ complex, thereby isolating water in the cellulose receiver from the copper to better define the area of reaction and provide better control of the etching area.

The types of solid materials which are useful as catalyst-carriers and reaction product receivers include fine particulate solids with relatively high surface areas, as well as the monolithic solids discussed above. It has been found that particulate solids which are essentially inert and have high surface areas can be coated with absorbed catalytic promoters to provide effective media for conducting a substantially dry copper etching process. Suitable particulate solids include silica, alumina, cellulose powder, silicic acid ($SiO_2*nH_2O$), Celite (diatomaceous earth, a natural silica) and aluminum oxide.

The particulate solids have a high carrying capacity for organic liquids such that the final combination can be about 50 wgt% liquid and still behave as a dry flowable powder. The mixture of particulate solid and organic liquid (product solvent and catalyst) have an open porous structure that permits free passage of gases. It has been found that these combinations can be used directly to catalyze the $Cu-NO_2$ reaction with simultaneous adsorption and removal of the $Cu(NO_3)_2$ product.

In operation, the dry powder into which the catalyst has been adsorbed is spread on the surface of the copper layer to be etched prior to exposure to the oxidizing gas. The reaction begins immediately upon contact with the gas, with the powder taking on a color characteristic of the oxidized reaction product. With a $NO_2$ oxidant, for example, the powder takes on the characteristic blue color of the $Cu(NO_3)_2$ product. With chlorine gas and a water catalyst/solvent, the powder takes on the bright green color of the $CuCl_2*H_2O$ product. A particular advantage of the particulate carrier is that it permits the free flow of the by-product NO gas formed in the $Cu-NO_2$ reaction.

The use of particulate receivers has also been found to be particularly helpful in preventing the problem of "tenting", i.e., the formation of bubbles which separate the catalyst from the copper and thereby interrupt the oxidizing reaction.

With a dry powder carrier, a fluidized bed reactor can be utilized in the etching of copper. A fluidized bed consists of loosely packed solid particles through which an upward flow of gas is maintained, causing the solid particles to circulate freely. In such a system, the particles take on properties usually associated with a liquid, e.g., flow under the influence of gravity, ready displacement around an inserted solid object, and rapid heat transfer between the solid and the fluidized particles.

In the etching process of the invention, the fluidized particles contain the catalytic promoters and also act as receivers for the reaction products. With an $NO_2$ oxidant, for example, the fluidizing gas can be a mixture of $NO_2$ and $O_2$, which serves to regenerate $NO_2$ from the NO by-product of the reaction. After reaction, particulates loaded with the reaction product can be heated gently to recover the organic promoter and more severely (200°–300° C.) to recover reactant $NO_2$ via the thermal decomposition of copper nitrate:

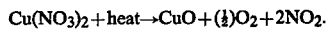

The copper oxide laden particulate material can be recycled until totally blocked by CuO and then sold for its copper value. Alternatively, CuO could be used as the particulate material, in which case, following solvent recovery and nitrate decomposition, reasonably pure CuO would remain. If desired, the solvent recovery and nitrate decomposition can be performed on a continuous basis by circulating the fluidized particles through different reactors.

The dry particulate carrier/receiver can also be employed in vertical spray etching systems of the type in which hot, corrosive, reactive liquid etchants have heretofore been employed. Here again, significant advantages would be gained from the dry etching process. In a vertical liquid spray etcher, the boards being etched are held in a vertical position, and non-uniform etching is a significant problem. The sprayed etchant tends to flow down the board after impact, with the lower portion of the board being etched much more rapidly than the upper portion. In addition, severe undercutting can occur in the lower portion of the board before the upper portion is etched. Likewise, the upper portion of a horizontal line may have more undercutting than the bottom portion of the same line due to the collection of etchant along the upper edge of the foil. Utilizing a particulate solid in place of the liquid etchant in a spray etcher effectively eliminates the problems caused by liquid flowing down the face of the board. In addition, since the particulate etchant bounces off the board rather than adhering and running down a board, a truer and more controllable anisotropic etch for copper is feasible. As in the case of a fluidized bed reactor, particularly advantageous results can be obtained by utilizing CuO as the solid particulate.

The invention provides a substantial simplification in the etching of copper and results in systems having better circuit element definition, easier process control, simpler by-product disposal, and ultimately lower cost.

The process of the invention differs from prior technology in the fundamental chemical process responsible for the dissolution of copper. With either $NO_2$ or $Cl_2$ as an oxidant, the actual specie responsible for Cu(O) oxidation is the nitrosodium ion, $NO^+$. The reaction of this specie with Cu(O) is an extremely rapid electron transfer from Cu(O) to $NO^+$, producing oxidized copper and nitric oxide, NO. The latter is recycled in the reaction by either reaction with $O_2$ in the $NO_2$ process or $Cl_2$ in the chlorine process. It should be noted that the Cu(I) which is produced initially is not stable under the reaction conditions of the invention and is very rapidly converted to the final Cu(II) product. Hence, the process yields a circuit board that is easily cleaned for subsequent processing.

An important feature of the invention is that neither $NO_2$ nor $Cl_2$ undergoes a facile direct reaction with metallic copper. The catalyst is employed to achieve reasonable reaction rates, and the process chemistry is easily controlled. Spatial control of the chemical action of the copper etching chemistry can be achieved either chemically or physically.

It is apparent from the foregoing that a new and improved process and structure have been provided for etching copper in the manufacture of printed circuit boards. While only certain presently preferred embodiments have been described in detail, as will be apparent to those familiar with the art, certain changes and modifications can be made without departing from the scope of the invention as defined by the following claims.

I claim:

1. In a process for etching copper on a substrate, the steps or protecting the copper where it is to be preserved with a film of organic resist material, covering the surface of the copper and the resist material with a hydrogel mixture of water and a polymer containing a surfactant, exposing the surface to an oxidizing gas to dissolve the copper, and removing the mixture and the dissolved copper from the substrate.

2. The process of claim 1 wherein the polymer is selected from the group consisting of polyacrylamide and poly(acrylic acid).

3. The process of claim 1 wherein the oxiding gas is $NO_2$.

4. The process of claim 1 wherein the resist is a lead-tin solder and a small amount of phosphate is added to the mixture to preserve the resist.

5. The process of claim 4 wherein the phosphate is phosphoric acid and a smaller amount of an organic phosphate is added to the mixture.

* * * * *